(12) United States Patent
Vogt et al.

(10) Patent No.: US 9,337,177 B2
(45) Date of Patent: May 10, 2016

(54) INTEGRATED SENSOR STRUCTURE

(71) Applicant: Fraunhofer-Gesellschaft zur Foerderung der angewandten Forschung e.V., Munich (DE)

(72) Inventors: Holger Vogt, Muehlheim (DE); Andreas Goehlich, Rheurdt (DE); Andreas Jupe, Bochum (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 406 days.

(21) Appl. No.: 13/774,944

(22) Filed: Feb. 22, 2013

(65) Prior Publication Data

US 2013/0228880 A1    Sep. 5, 2013

(30) Foreign Application Priority Data

Feb. 24, 2012 (DE) .......................... 10 2012 202 846

(51) Int. Cl.

| H01L 21/00 | (2006.01) |
|---|---|
| H01L 27/02 | (2006.01) |
| H01L 21/82 | (2006.01) |
| B82Y 15/00 | (2011.01) |
| H01L 27/146 | (2006.01) |
| B82Y 40/00 | (2011.01) |

(52) U.S. Cl.
CPC .............. *H01L 27/0248* (2013.01); *B82Y 15/00* (2013.01); *H01L 21/82* (2013.01); *B82Y 40/00* (2013.01); *H01L 27/14643* (2013.01); *H01L 27/14687* (2013.01)

(58) Field of Classification Search
CPC ........................................................ H01L 21/82
USPC ........................................................ 438/48–49
See application file for complete search history.

(56) References Cited

U.S. PATENT DOCUMENTS

| 2007/0164430 A1 | 7/2007 | Lin et al. |
| 2010/0171093 A1 | 7/2010 | Kabir et al. |

OTHER PUBLICATIONS

Haque, M et al., "Growth of Carbon Nanotubes on Fully Processed Silicon-On-Insulator CMOS Substates", J. Nanosci. Nanotechnol. vol. 8, No. 11, 2008, 5667-5672.

*Primary Examiner* — Samuel Gebremariam
(74) *Attorney, Agent, or Firm* — Perkins Coie LLP (57) ABSTRACT

Embodiments of the present invention provide a method for manufacturing an integrated sensor structure. In one step, a semiconductor substrate having integrated readout electronics and a metallization structure is provided, the metallization structure including tungsten and being exposed on a surface of the semiconductor substrate. In another step, a sensor layer is deposited onto the surface of the semiconductor substrate, the semiconductor substrate having the integrated readout electronics and the metallization structure being exposed, when depositing the sensor layer, to a temperature which is above a maximum temperature used when generating the integrated readout electronics such that the sensor layer is connected to the integrated readout electronics via the metallization structure.

18 Claims, 6 Drawing Sheets

INTEGRATED SENSOR STRUCTURE

CROSS-REFERENCE TO RELATED APPLICATION

This application claims priority from German Patent Application No. 102012202846.3, which was filed on Feb. 24, 2012 and is incorporated herein by reference in its entirety.

BACKGROUND OF THE INVENTION

Embodiments of the present invention relate to a method for manufacturing an integrated sensor structure. Further embodiments of the present invention relate to an integrated sensor structure. Further embodiments of the present invention relate to a method for manufacturing a CMOS-integrated sensor structure and to a CMOS-integrated sensor structure.

It is know from literature [Ke Wang, Harvey A. Fishman, Hongjie Dai and James S. Harrist, "Neural Stimulation with a Carbon Nanotube Microelectrode Array" Nano Letters 2006 6 (9), 2043-2048] that depositing CNTs (Carbon Nano Tubes) as a functional layer onto electrode structures improves the charge transfer capacity and improves cell growth onto the electrodes.

When depositing CNTs directly onto the electrodes on a CMOS (Complementary Metal Oxide Semiconductor) substrate, the difficulty resulting is that "normal" CMOS substrates are damaged irreparably using conventional CVD (Chemical Vapor Deposition) methods, due to the comparably high depositing temperature for the functional layer (such as, for example, CNTs) of roughly 700° C. necessary. The influence of the additional temperature budget of depositing the functional layer generally causes non-tolerable parameter shifts of devices (such as, for example, transistors) and damages of, for example, the metallization (in particular in aluminum metallization, which is frequently used in CMOS technology, with a comparably low melting point) and contacts, for example caused by the "spiking effect" by the barrier layers failing (such as, for example, by the formation of cracks).

This gives rise to a wide spread view, which has also been published repeatedly [Wang, X; Zhang, Y; Haque, M. S.; Teo, K. B. K; Mann, M; Unalan, H. E.; Warburton, P. A.; Udrea, F; Milne, W. I.; "Deposition of Carbon Nanotubes on CMOS," Nanotechnology, IEEE Transactions on, vol. PP, no. 99, pp. 1.0 doi: 10.1109/TNANO.2009.2038787], that it is not possible to apply functional or sensor layers, like CNTs, directly onto a CMOS structure using a high-temperature CVD method, after finishing the metallization of the CMOS substrate.

The prior art known thus states either using alternative depositing methods for CNTs, such as, for example, low-temperature "hot filament" deposition [Wang, X; Zhang, Y; Haque, M. S.; Teo, K. B. K; Mann, M; Unalan, H. E.; Warburton, P. A.; Udrea, F; Milne, W. I.; "Deposition of Carbon Nanotubes on CMOS," Nanotechnology, IEEE Transactions on, vol. PP, no. 99, pp. 1.0 doi: 10.1109/TNANO.2009.2038787] or else special low-temperature CVD depositions [S. Hofmann, C. Ducati, J. Robertson and B. Kleinsorge, "Low-temperature growth of carbon nanotubes by plasma-enhanced chemical vapor deposition", Appl. Phys. Lett. 83, 135 (2003), doi: 10.1063/1.1589187]. Additionally, "cold" depositing methods, such as, for example, dip coating a suspension onto a CMOS structure or dielectrophoresis for "cold" orientation of the CNTs between electrodes are resorted to [Sung Min Seo; Jun Ho Cheon; Seok Hyang Kim; Tae June Kang; Jung Woo Ko; In-Young Chung; Yong Hyup Kim; Young June Park; "Carbon Nanotube-Based CMOS Gas Sensor IC: Monolithic Integration of Pd Decorated Carbon Nanotube Network on a CMOS Chip and Ist Hydrogen Sensing, "Electron Devices, IEEE Transactions on, vol. 58, no. 10, pp 3604-3608, October 2011 doi: 10.1109/TED.2011.2164249]. A different approach uses special heating structures which are integrated into the CMOS element and which allow locally heating up the electrodes, without thereby damaging the surrounding CMOS transistors. An example of such a CMOS structure comprising an integrated micro heater is described, for example, in the publication by [Sumita Santra, Syed Z Ali, Prasanta K Guha, Guofang Zhong, John Robertson, James A Covington, William I Milne, Julian W Gardner and Florin Udrea, "Post-CMOS wafer level growth of carbon nanotubes for low-cost microsensors—a proof of concept", 2010 Nanotechnology 21 485301 doi: 10.1088/0957-4484/21/48/485301].

The methods mentioned above suffer from the disadvantages of losses in quality of the layers or in the depositing speed achievable for the layers or comparably large apparatus expenditure for low-temperature deposition.

SUMMARY

According to an embodiment, a method for manufacturing an integrated sensor structure may have the steps of: providing a semiconductor substrate having integrated readout electronics and a metallization structure which includes tungsten and is exposed on a surface of the semiconductor substrate; and depositing a sensor layer onto the surface of the semiconductor substrate; wherein the semiconductor substrate having the integrated readout electronics and the metallization structure is exposed, when depositing the sensor layer, to a temperature which is above a maximum limiting temperature used when generating the integrated readout electronics such that the sensor layer is connected to the integrated readout electronics via the metallization structure; wherein providing the semiconductor substrate having the integrated readout electronics includes providing a bulk semiconductor substrate; and wherein providing the semiconductor substrate having the metallization structure has: manufacturing contacts; and manufacturing conductive traces made of tungsten; wherein the contacts electrically contact terminal regions of the integrated readout electronics to the conductive traces.

According to another embodiment, an integrated sensor structure may have: a semiconductor substrate having integrated readout electronics and a metallization structure which includes tungsten and is exposed on a surface of the semiconductor substrate; and a sensor layer deposited onto the surface of the semiconductor substrate at a temperature which is above a maximum limiting temperature used when generating the integrated readout electronics such that the sensor layer is connected to the integrated readout electronics via the metallization structure; wherein the semiconductor substrate is a bulk semiconductor substrate, wherein the metallization structure has conductive traces made of tungsten and contacts, and wherein the contacts electrically contact terminal regions of the integrated readout electronics to the conductive traces.

The present invention is based on the finding that a semiconductor substrate comprising a tungsten metallization structure (such as, for example, conductive traces, contacts and/or vias which comprise tungsten or consist of tungsten) allows depositing a sensor structure onto the surface of the semiconductor substrate at a temperature which is above a maximum limiting temperature used when generating the integrated readout electronics. Exemplarily, in the case of a CMOS semiconductor substrate, the maximum temperature used, and allowed, when generating the CMOS readout electronic is roughly 400° C. to 450° C., whereas the inventive concept allows depositing a sensor layer onto the surface of the CMOS semiconductor substrate at a temperature of 500° C. to 750° C., without considerably deteriorating or damaging the CMOS readout electronics. The conventional maximum limiting temperature used when manufacturing the CMOS substrate is determined, for example, by the terminating forming gas tempering and is roughly 400° C. to 450° C.

BRIEF DESCRIPTION OF THE DRAWINGS

Embodiments of the present invention will be detailed referring to the appended drawings, in which.

DETAILED DESCRIPTION OF THE INVENTION

Same elements or elements of same effects will be provided with the same reference numerals in the subsequent description of embodiments of the present invention such that the description thereof in the different embodiments is mutually exchangeable.

Figure 1:
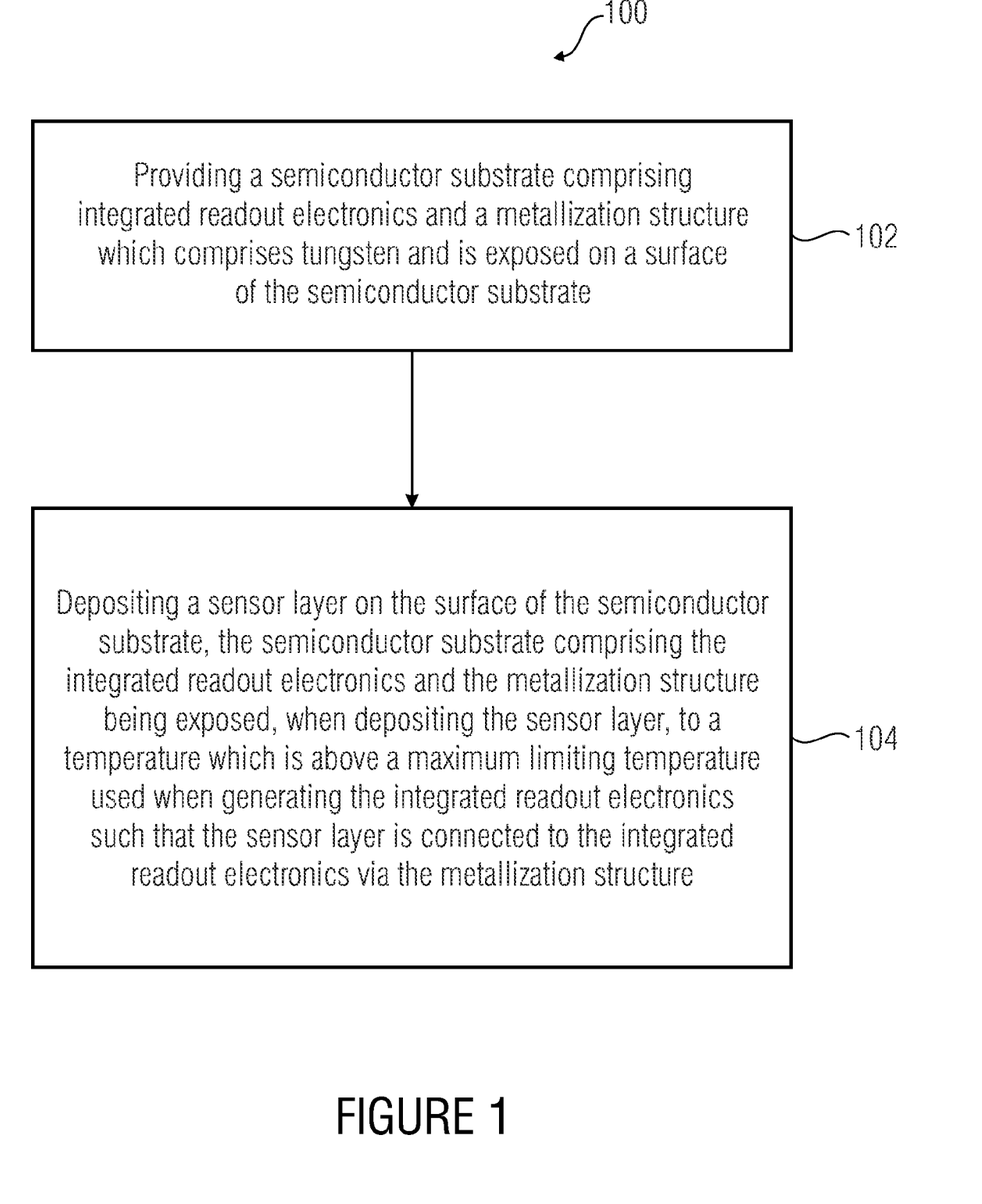
FIG. 1 shows a flow chart of a method for manufacturing an integrated sensor structure in accordance with an embodiment of the present invention.

FIG. 1 shows a flow chart of a method 100 for manufacturing an integrated sensor structure in accordance with an embodiment of the present invention. In step 102, a semiconductor substrate comprising integrated readout electronics and a metallization structure is provided, the metallization structure including tungsten or essentially consisting of tungsten and being exposed on a surface of the semiconductor substrate. In another step 104, a sensor layer is deposited onto the surface of the semiconductor substrate, the semiconductor substrate (202) comprising the integrated readout electronics (206) and the metallization structure (208) being exposed, when depositing the sensor layer, to a temperature which is above a maximum limiting temperature used when generating the integrated readout electronics such that the sensor layer is connected to the integrated readout electronics via the metallization structure.

In embodiments, providing a semiconductor substrate comprising a tungsten metallization structure (such as, for example, conductive traces, contacts and/or vias comprising tungsten or consisting of tungsten) allows depositing a sensor structure onto the surface of the semiconductor substrate at a temperature which is above a maximum limiting temperature used when generating the integrated readout electronics, without considerably deteriorating or damaging the readout electronics.

The maximum temperature allowed or used, when generating CMOS readout electronics (such as, for example, a CMOS transistor) of a CMOS semiconductor substrate, for example, is roughly 450° C. Conventionally, depositing a sensor layer onto the surface of the semiconductor substrate at a temperature which is above 450° C. would result in a deterioration or damage in the CMOS readout electronics. The inventive method in contrast allows depositing a sensor layer onto the surface of the semiconductor substrate at a temperature of 500° C. to 750° C. or 450° C. to 900° C. (such as, for example, at a temperature of 450° C., 500° C., 550° C., 600° C., 650° C., 700° C., 750° C., 800° C., 850° C. or 900° C.), without considerably deteriorating or damaging the CMOS readout electronics.

Figure 2:
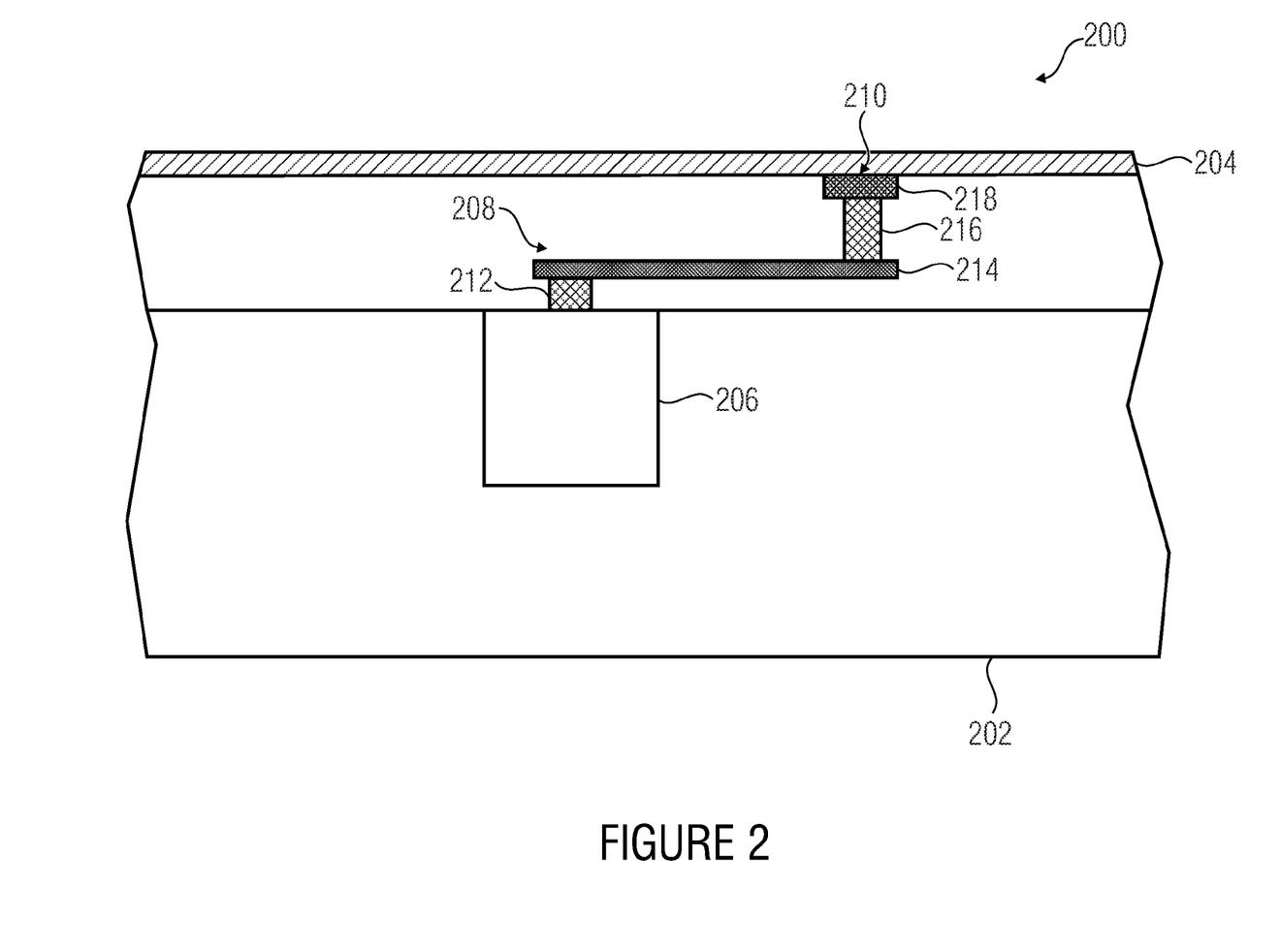
FIG. 2 shows a layer setup of an integrated sensor structure in accordance with an embodiment of the present invention.

FIG. 2 shows a layer setup of an integrated sensor structure 200 in accordance with an embodiment of the present invention. The integrated sensor structure 200 comprises a semiconductor substrate 202 and a sensor layer 204. The semiconductor substrate 202 comprises integrated readout electronics 206 and a metallization structure 208, the metallization structure 208 including tungsten and being exposed on a surface 210 of the semiconductor substrate 202. The sensor layer 204 is deposited onto the surface 210 of the semiconductor substrate 202 at a temperature which is above a maximum temperature used when generating the integrated readout electronics 206 such that the sensor layer 204 is connected to the integrated readout electronics 206 via the metallization structure 208.

In embodiments, the metallization structure 208 may comprise a contact 212, a conductive trace 214, a via 216 and a top metallization sheet 218. In embodiments, the top metallization sheet 218 may be connected to an electrode, such as, for example, a titanium/titanium-nitride electrode 220, via a via (see, for example, FIG. 3). Alternatively, the top metallization sheet 218 may be used directly as a metallization terminal for electrically connecting the sensor layer 204.

In addition, the contact 212 may electrically contact a terminal region of the integrated readout electronics 206 to the conductive trace 214, whereas the via 216 may electrically contact the conductive trace 214 to the top metallization sheet 218 such that the sensor layer 204 is connected to the integrated readout electronics 206 via the metallization structure 208. The contact 212, the conductive trace 214, the via 216 and/or the top metallization sheet 218 may comprise tungsten and/or consist of tungsten.

The inventive method 100 for manufacturing an integrated sensor structure may be used for manufacturing the integrated sensor structure shown in FIG. 2. Thus, in step 102, the semiconductor substrate 202 comprising the integrated readout electronics 206 and the metallization structure 208 is provided, the metallization structure 208 including tungsten and being exposed on the surface 210 of the semiconductor substrate 202. In another step 104, the sensor layer 204 is deposited onto the surface 210 of the semiconductor substrate 202 at a temperature which is above a maximum limiting temperature used when generating the integrated readout electronics 206 such that the sensor layer 204 is connected to the integrated readout electronics 206 via the metallization structure 208.

In embodiments, step 104 of depositing the sensor layer 204 may include chemical vapor deposition (CVD). Additionally, step 104 of depositing the sensor layer 204 may include growing carbon nanotubes (CNTs), PZT (Plombium-(Lead-) Zirconate-Titanate) or polysilicon.

Exemplarily, carbon nanotubes may be grown onto the surface 210 of the semiconductor substrate 202 by a CVD high-temperature step (such as, for example, at a temperature of 500° C. to 750° C. for 10, 20 or 30 minutes) so as to realize a hydrogen gas sensor, for example. In addition, a piezoactor and/or piezosensor may be realized by depositing PZT and subsequently heating or annealing. Additionally, a cantilevered membrane structure may be manufactured and thus a pressure sensor, for example, be realized by depositing polysilicon at a temperature of typically 620° C. (or at a temperature of 500° C. to 750° C.).

In addition, the inventive method 100 for manufacturing an integrated sensor structure 200 may be used to provide a semiconductor substrate 202 (such as, for example, a CMOS semiconductor substrate) comprising a high-melting tungsten metallization 208. The sensor layer 204 may be deposited directly over the entire area onto said substrate 202 at a comparably high depositing temperature in the range of typically 500° C. to 750° C. (in contrast to local heating up in the prior art) and, if necessitated, be patterned in another step.

Figure 4:
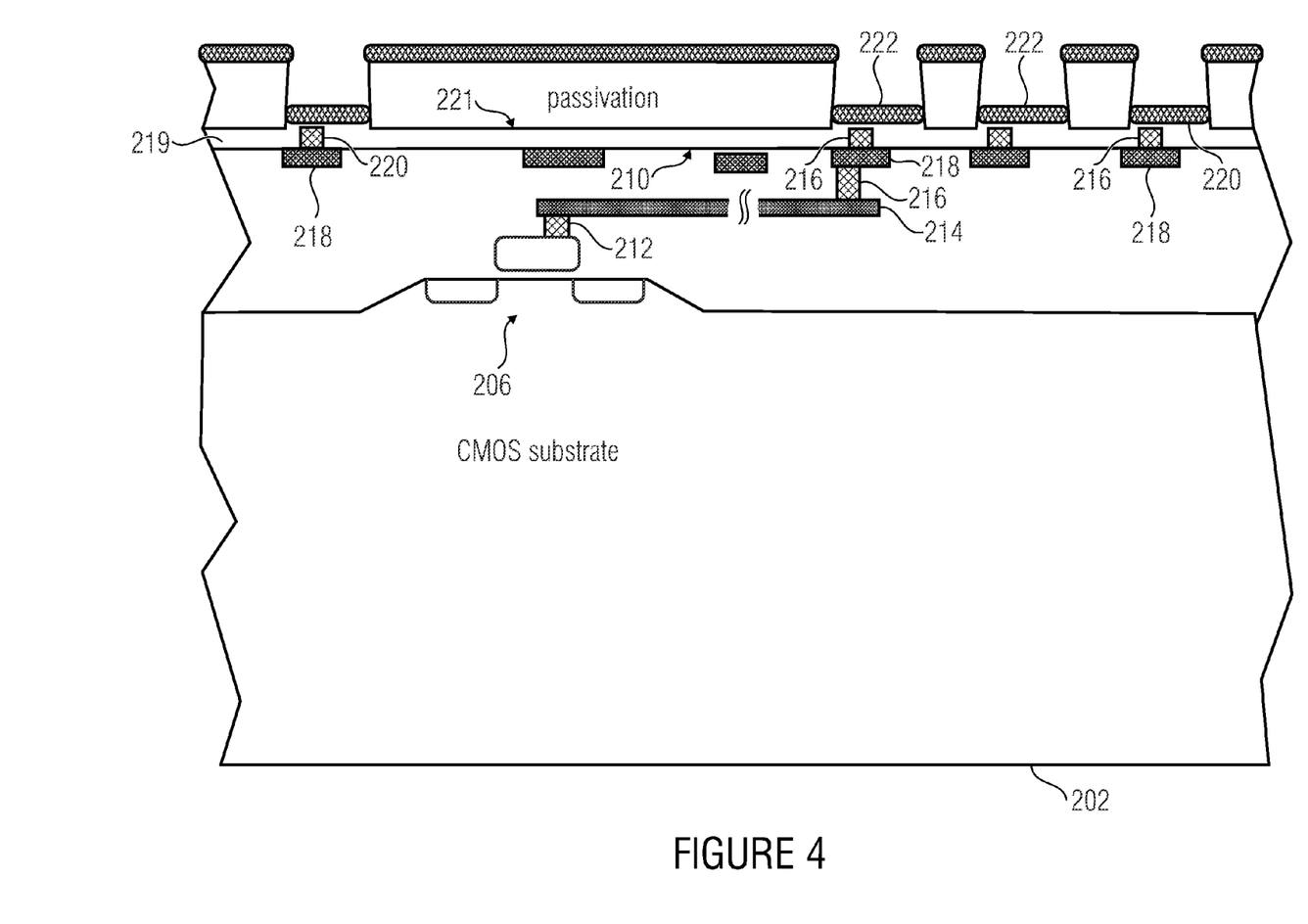
FIG. 4 shows a cross-section of the integrated sensor structure after a step of applying a starter layer onto electrodes of the CMOS semiconductor substrate in accordance with an embodiment of the present invention.
Figure 5:
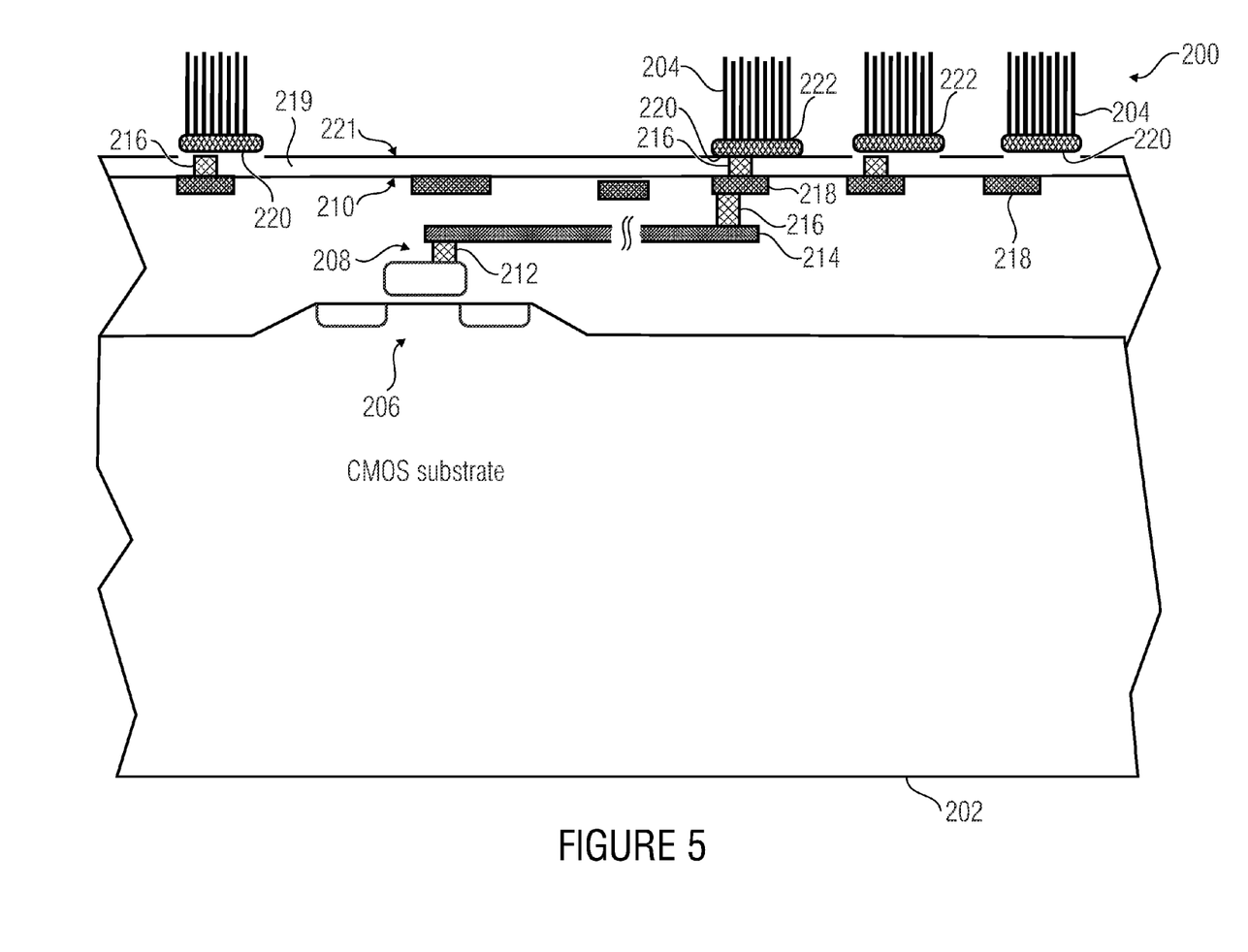
FIG. 5 shows a cross-section of the integrated sensor structure after the step of depositing the sensor layer onto the surface of the CMOS semiconductor substrate in accordance with an embodiment of the present invention.

Embodiments of the method 100 for manufacturing an integrated sensor structure 200 will be described in greater detail below referring to FIGS. 3-5. It is exemplarily assumed here that the semiconductor substrate 202 is a CMOS semiconductor substrate 202 (such as, for example, a wafer substrate including implants and/or layers) and that the readout electronics 206 is CMOS readout electronics 206 (exemplarily symbolized by a CMOS transistor). The layer setup shown in FIG. 3 here serves for illustrating step 102 of providing the semiconductor substrate 202, whereas FIGS. 4 and 5 illustrate step 104 of depositing the sensor layer 204 onto the surface of the semiconductor substrate 204. The subsequent description is of course also applicable to different semiconductor substrates 202 including different readout electronics 206, such as, for example, a BiCMOS (Bipolar CMOS) semiconductor substrate including a BiCMOS transistor, or else an SOI (Silicon-On-Insulator) semiconductor substrate comprising an SOI-CMOS transistor.

Figure 3:
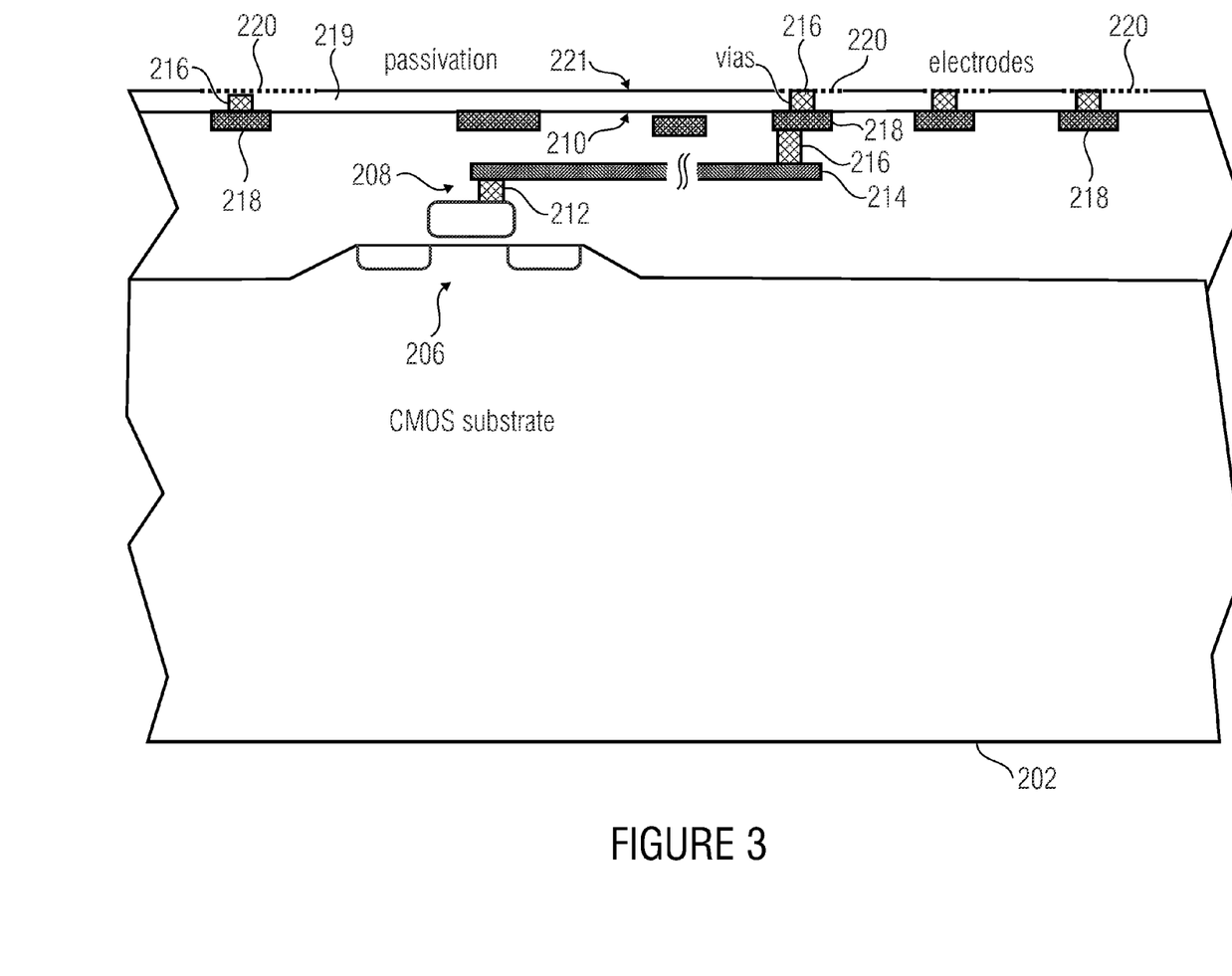
FIG. 3 shows a cross-section of the integrated sensor structure after the step of providing the CMOS semiconductor substrate in accordance with an embodiment of the present invention.

FIG. 3 shows a cross-section of the integrated sensor structure 200 after step 102 of providing the CMOS semiconductor substrate 202 in accordance with an embodiment of the present invention. In embodiments, step 102 of providing the semiconductor substrate 202 (such as, for example, CMOS semiconductor substrate 202) comprising the metallization structure 208 may include steps of manufacturing contacts 212 and manufacturing conductive traces 214 which comprise tungsten, the contacts 212 electrically contacting terminal regions of the integrated readout electronics 206 (such as, for example, terminal regions of the CMOS transistor 206 or also regions in the Si substrate) to the conductive traces 214. In some embodiments, the conductive traces 214 may include exclusively tungsten. In some embodiments, the conductive traces 214 may comprise neither copper nor aluminum.

In embodiments, step 102 of providing the semiconductor substrate 202 may include steps of manufacturing a passivation 219 comprising via openings on the surface 210 of the semiconductor substrate 202 and manufacturing vias 216 which comprise tungsten in the via openings of the passivation 219 such that the vias 216 are connected to the metallization structure 208. In this case, the sensor layer 204 may be deposited onto a surface 221 of the passivation 219 such that the sensor layer 204 is connected to the integrated readout electronics 206 (such as, for example, CMOS transistor) via the vias 216 and the metallization structure 208.

The vias 216 may be tungsten plugs 216. Additionally, manufacturing the passivation 219 may include chemical-mechanical polishing (CMP), the result being a basically smooth sensor surface. It may also be of advantage to displace the bond-pads to the back surface using through-silicon vias (TSV) such that the sensor side is not disturbed by bond wires.

In embodiments, step 102 of providing the semiconductor substrate 202 may additionally include a step of manufacturing electrodes 220 on the surface 221 of the passivation 219. In this case, the sensor layer 204 may be deposited onto the electrodes 220 such that the sensor layer 204 is connected to the integrated readout electronics 206 via the electrodes 220, vias 216 and metallization structure 208.

The step of manufacturing the electrodes 220 here may include steps of sputtering, tempering or depositing, such as, for example, atomic layer deposition (ALD), a titanium seed layer onto the surface 221 of the passivation and sputtering, tempering or depositing (such as, for example, ALD) a titanium-nitride layer onto the titanium seed layer.

Exemplarily, the passivation 219 of the semiconductor substrate 202 (such as, for example, CMOS semiconductor substrate 202) may comprise a basically smooth surface 221 onto which the sensor electrodes 220 may be deposited as a thin-film layer. A sputtered titanium-nitride film or one applied using an ALD method may be used as the electrode material (in thicknesses in the range of 10 nm to 200 nm, 5 nm to 500 nm or 1 nm to 1000 nm). A thin seed layer (typically titanium at 15 nm (or 5 nm, 10 nm, 20 nm, 25 nm, 30 nm or 35 nm)) may be sputtered below the titanium-nitride film. The vias 216 connecting the sensor electrodes 220 to the topmost tungsten metallization sheet (metallization terminal) 218 may be implemented as so-called "tungsten plugs", that is the via openings in the passivation layer 219 may be filled with a tungsten layer. The tungsten layer may then be polished down to the passivation layer using a CMP (Chemical-Mechanical Polishing) method until only the filled plugs 216 remain.

Exemplarily, the substrate 202 may comprise an essentially smooth passivation surface 221 which may be generated using the CMP method. The passivation layer 219 may consist of a nitride and/or oxide layer. The metallization 208 may be generated by one or several tungsten metal sheets 214 and 218. The electrical connections between the metal sheets, or between the bottommost metal sheet and the substrate (vias or contacts), may be generated by tungsten plugs using tungsten CMP and may also include several metal sheets. It is also possible for only the topmost metal sheet 218 to be planarized. A PECVD (Plasma-Enhanced Chemical Vapor Deposition) method may be used for depositing the tungsten layer. The thin-film electrodes 220 may be deposited on the surface 221 of the passivation 219 above the tungsten plus 216. The electrodes 220 may comprise a thin sputtered titanium/titanium-nitride layer or consist of a thin sputtered titanium/titanium-nitride layer.

FIG. 4 shows a cross-section of the integrated sensor structure 200 after a step of depositing a starter layer 222 onto electrodes 220 of the CMOS semiconductor substrate 202 in accordance with an embodiment of the present invention. The semiconductor substrate 202 shown in FIG. 4 basically corresponds to the CMOS semiconductor substrate 202 shown in FIG. 3, wherein a starter layer 222 has been deposited onto the electrodes 220 (such as, for example, using a lift-off photo technique).

In embodiments, step 104 of depositing the sensor layer 204 may additionally include a step of applying a starter layer 222 onto the electrodes 220, the sensor layer 204 being deposited onto the starter layer 222.

The starter layer may be applied onto the electrodes by means of a lift-off photo technique (pattern transfer technique using photo resist), for example. In the lift-off photo technique or pattern transfer technique, a sacrificial layer which is applied for protecting the underlying material is used for manufacturing a thin patterned layer on a surface.

FIG. 5 shows a cross-section of the integrated sensor structure 200 after step 104 of depositing or growing the sensor layer 204 onto the surface of the CMOS semiconductor substrate 202 in accordance with an embodiment of the present invention. The sacrificial layer (generally photo resist) has been removed again before depositing or growing the sensor layer. The integrated sensor structure 200 shown in FIG. 5 basically comprises the CMOS semiconductor substrate 202, shown in FIG. 4, comprising the starter layer 220 applied onto the surface of the CMOS semiconductor substrate 202, and a sensor layer 204 deposited onto the starter layer 222, such as, for example, CNT.

In embodiments, step 104 of depositing the sensor layer 204 may include chemical vapor deposition. Additionally, step 104 of depositing the sensor layer may include growing carbon nanotubes, PZT or polysilicon.

Integration of the sensor layer 204 will be described below using the example of growing CNTs onto the semiconductor substrate 202 (such as, for example, CMOS semiconductor substrate). A nano-particle starter layer, such as, for example, made of iron nano-particles, may be applied onto the electrodes 220 for growing CNTs (see FIG. 4). This may be performed by a so-called "lift-off" photo technique, which means that a photo technique is applied onto the electrodes, which is opened above the electrodes 220. Subsequently, the nano-particle layer may be applied, such as, for example, by means of ion or laser sputtering. After removing the photo technique, the starter layer will remain only on the electrodes 220. The CNT layer 204 can be deposited directly onto this substrate 202 using a CVD high-temperature step. The CNTs here will grow only on areas which are covered by the structure layer (see FIG. 5).

As can be seen in FIGS. 3 to 5, the semiconductor substrate may be a CMOS semiconductor substrate 202 which is implemented in bulk technology. As test series performed have shown, a CMOS technology which is implemented as a so-called bulk technology (in contrast to an SOI (Silicon-On-Insulator) technology using an SOI substrate) is particularly suitable for a CMOS substrate 202. The combination of bulk technology and tungsten metallization is conventionally unusual.

The influence of an additional temperature budget (30 minutes at 700° C.) on the threshold of transistors (n-channel and p-channel), on the metallization 208 (that is vias, contacts and layer resistors) of different CMOS technologies (SOI technology with tungsten metallization, bulk technology with tungsten metallization, bulk technology with aluminum metallization) has been analyzed in different test series.

Figure 6A:
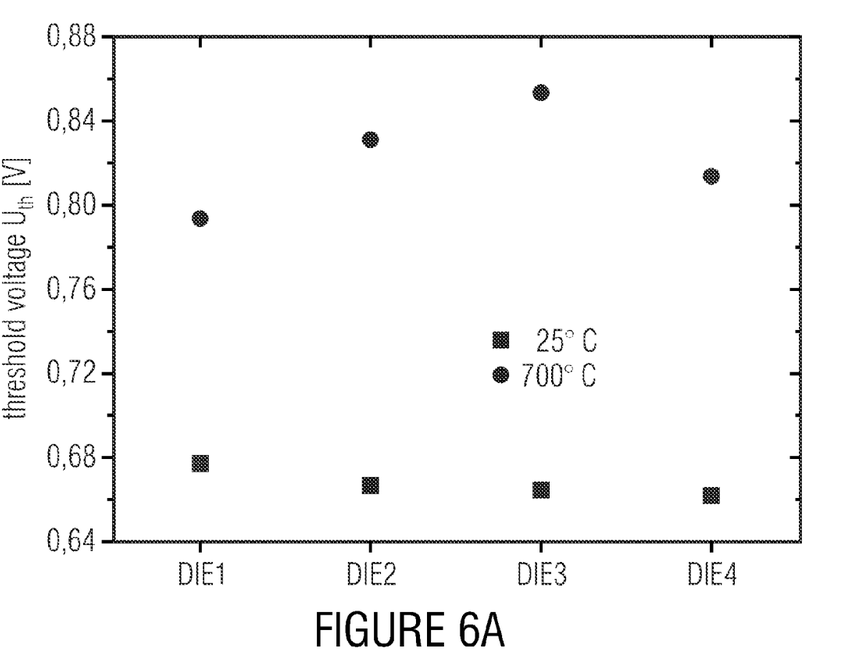
FIG. 6a shows, in a diagram, the threshold voltages of four NMOS transistors in bulk technology comprising a tungsten metallization, before and after tempering simulating high-temperature deposition of a sensor layer onto the surface of the bulk CMOS substrate comprising the tungsten metallization.

FIG. 6a shows the threshold voltages $U_{th}$ of NMOS transistors 206 of four different test structures before (25° C.) and after tempering, simulating a high-temperature deposition (700° C.) of the sensor layer 204, on the surface of the bulk CMOS substrate including a tungsten metallization (W=20 μm, L=0.8 μm) in a diagram. The ordinate here describes the threshold voltage in volts and the abscissa indicates the NMOS transistors of the four test structures (DIE1 to DIE4).

Figure 6B:
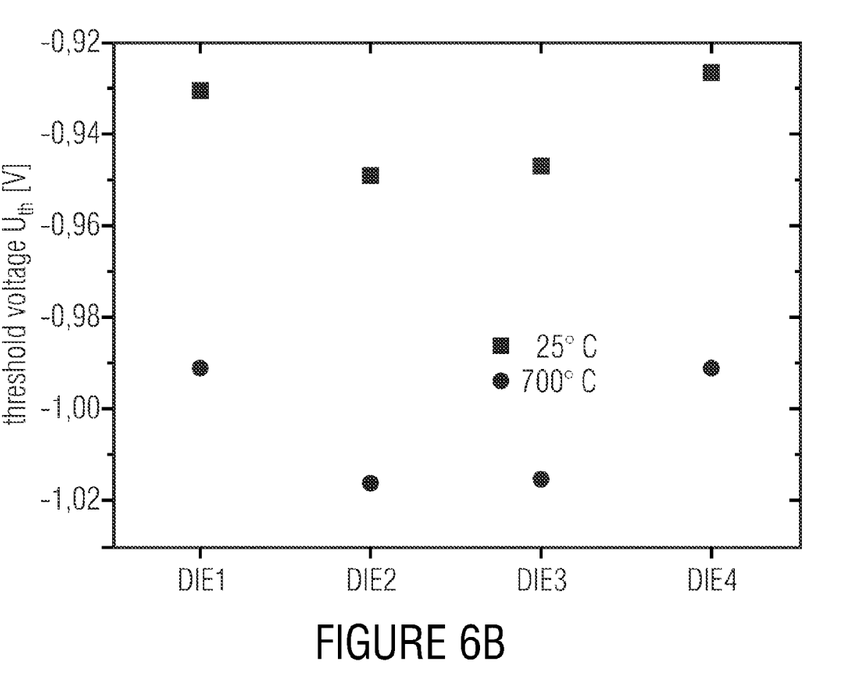
FIG. 6b shows, in a diagram, the threshold voltages of four PMOS transistors in bulk technology comprising a tungsten metallization, before and after tempering simulating high-temperature deposition of the sensor layer onto the surface of the bulk CMOS substrate comprising the tungsten metallization.

FIG. 6b shows the threshold voltages $U_{th}$ of PMOS transistors 206 of four different test structures before (25° C.) and after tempering, simulating a high-temperature deposition (700° C.) of the sensor layer 204, on the surface of the bulk CMOS substrate comprising a tungsten metallization (W=20 μm, L=0.8 μm) in a diagram. The ordinate here describes the threshold voltage in volts and the abscissa indicates the PMOS transistors of the four different integrated sensor structures (DIE1 to DIE4).

In the comparative analysis, the combination of conventional 0.8 μm bulk technology and LOCOS (Local Oxidation of Silicon) insulation which, however, has been processed using a tungsten metallization instead of the usual aluminum metallization, has been found out to be particularly promising since the parameter shifts of the threshold voltages of the transistors have been found to be in an acceptable range (ΔV<250 mV), after additional tempering (30 minutes at 700° C.) (whereas in SOI technology, for example, including tungsten metallization, parameter shifts of up to 2 V have been measured, see FIG. 6). The tungsten metallization in this trial has been deposited directly into the contact holes using a CVD method. A titanium/titanium-nitride adhesive layer is arranged below the metallization. After additional tempering, the contact and layer resistances were also shifted only slightly and fully functional. The comparatively small shifts in the threshold voltages of the transistors may, if necessitated, be adjusted by a (slight) lead of the implant dose for the threshold voltages in the basic process of the CMOS substrate, without thereby disturbing the remaining process.

In other words, FIGS. 6a and 6b exemplarily show the result of a tempering trial. What is shown are the values of the threshold voltage before and after additional tempering. The squared marks describe the values of the transistor thresholds (of the digital transistors) before tempering, and the round marks describe the values of the transistor thresholds after 30 minutes of tempering at 700° C. The shift in PMOS transistors is roughly 100 mV, in NMOS transistors roughly 200 mV.

Embodiments of the present invention provide a method for manufacturing a CMOS-integrated sensor structure 200 and a CMOS-integrated sensor structure 200. Apart from biological, chemical and physical sensors, the sensor structure 200 also includes selectable electrode structures, such as, for example, for stimulating nerve cells or for receiving signals from nerve cells.

Embodiments of the present invention allow "direct" deposition of a sensor layer 204, which necessitates a high temperature budget (≤750° C.), onto a CMOS substrate 202 or a CMOS substrate 202 prepared with electrode structures, which already contains the readout electronics 206. The readout electronics 206 in the substrate 202 may of course also be realized by a different technology, such as, for example, bipolar or BiCMOS, instead of CMOS technology. A specific example of a sensor application is integrating carbon nanotubes onto a CMOS substrate 202 for realizing a hydrogen gas sensor, for example. The carbon nanotubes here may be grown onto electrode structures 220 which are exemplarily connected to a gate of a readout transistor 206 and modulate the drain current of a readout transistor 206. Another example of a CMOS-integrated sensor structure relates to realizing intelligent electrode structures, for example for stimulating nerve cells or for receiving signals from nerve cells. Electrode structures of this kind are typically implemented as multi-electrode arrays (MEAs).

Embodiments of the present invention thus allow a simple and cheap type of post-CMOS integration of functional or sensor layers at a high temperature budget, such as, for example, of CNT layers.

Further embodiments of the present invention provide a sensor structure 200 comprising a sensor film 204 or a functional layer 204 which is deposited directly onto a CMOS substrate 202 containing a tungsten metallization at a temperature in the range of 500° C. to 750° C.

Further embodiments of the present invention relate to a CMOS substrate manufactured in bulk technology.

Further embodiments of the present invention relate to a CMOS substrate 202 comprising a planarized surface which may be planarized by means of a CNT method.

Further embodiments of the present invention relate to a CMOS substrate 200 comprising planar electrodes of, for example, titanium nitride.

Further embodiments of the present invention relate to a sensor or electrode structure 200 comprising a planar surface and grown CNTs as a functional layer 204.

Further embodiments of the present invention relate to a functional layer 204 which includes polysilicon and is deposited at a depositing temperature of roughly 620° C., for example for realizing micro- or nano-mechanical structures.

Although some aspects have been described in connection with a device, it is pointed out that these aspects also represent a description of the corresponding method such that a block or an element of a device is also to be understood to be a corresponding method step or a characteristic of a method step. In analogy, aspects having been described in connection with a method step or as a method step, also represent a description of a corresponding block or detail or characteristic of a corresponding device. Some or all method steps may be executed by a hardware apparatus (or using a hardware apparatus), such as, for example, a microprocessor, a programmable computer or an electronic circuit. In some embodiments, some or several of the most important method steps may be executed by such an apparatus.

The embodiments described above only represent an illustration of principles of the present invention. It is pointed out that modifications and variations of arrangements and details described herein will be obvious to other persons skilled in the art. Thus, the invention is intended to be limited only by the scope of protection of the following claims, but not by specific details which have been presented herein using the description and discussion of embodiments.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for manufacturing an integrated sensor structure, comprising:
providing a semiconductor substrate comprising integrated readout electronics and a metallization structure which comprises tungsten, wherein the metallization structure is exposed at a surface of the semiconductor substrate; and
depositing a sensor layer onto the surface of the semiconductor substrate;
wherein, when depositing the sensor layer, the semiconductor substrate comprising the integrated readout electronics and the metallization structure is exposed to a temperature which is above a maximum temperature used and allowed when generating the integrated readout electronics such that the sensor layer is connected to the integrated readout electronics via the metallization structure;
wherein providing the semiconductor substrate comprising the integrated readout electronics comprises providing a bulk semiconductor substrate; and
wherein providing the semiconductor substrate comprising the metallization structure comprises:
manufacturing contacts; and
manufacturing conductive traces made of tungsten;
wherein the contacts electrically contact terminal regions of the integrated readout electronics to the conductive traces.

2. The method in accordance with claim 1, wherein depositing the sensor layer comprises chemical vapor deposition.

3. The method in accordance with claim 1, wherein depositing the sensor layer comprises growing carbon nanotubes, plombium-zirconate-titanate or polysilicon.

4. The method in accordance with claim 1, wherein providing the semiconductor substrate comprises:
manufacturing a passivation comprising via openings on the surface of the semiconductor substrate; and
manufacturing vias which comprise tungsten in the via openings of the passivation such that the vias are connected to the metallization structure;
wherein the sensor layer is deposited onto a surface of the passivation such that the sensor layer is connected to the integrated readout electronics via the vias and the metallization structure.

5. The method in accordance with claim 4, wherein the vias are tungsten plugs.

6. The method in accordance with claim 4, wherein manufacturing the passivation comprises chemical-mechanical polishing (CMP).

7. The method in accordance with claim 4, wherein providing the semiconductor substrate comprises:
manufacturing electrodes on the surface of the passivation such that the electrodes are connected to the metallization structure;
wherein the sensor layer is deposited onto the electrodes such that the sensor layer is connected to the integrated readout electronics via the electrodes, vias and metallization structure.

8. The method in accordance with claim 7, wherein manufacturing the electrodes comprises:
sputtering, tempering or depositing a titanium seed layer onto the surface of the passivation; and
sputtering, tempering or depositing a titanium-nitride layer onto the titanium seed layer.

9. The method in accordance with claim 7, wherein depositing the sensor layer comprises:
applying a starter layer onto the electrodes;
wherein the sensor layer is deposited onto the starter layer.

10. The method in accordance with claim 9, wherein the starter layer is applied onto the electrodes by means of a photo technique.

11. The method in accordance with claim 1, wherein providing the semiconductor substrate comprises plasma-enhanced chemical vapor deposition of the metallization structure.

12. The method in accordance with claim 1, wherein the conductive traces comprise exclusively tungsten.

13. The method in accordance with claim 1, wherein the conductive traces do not comprise copper or aluminum.

14. The method in accordance with claim 1, wherein providing the semiconductor substrate with the integrated readout electronics comprises providing a semiconductor substrate with a CMOS transistor, BiCMOS transistor or bipolar transistor.

15. The method in accordance with claim 1, wherein providing the semiconductor substrate comprises providing a semiconductor substrate with LOCOS insulation.

16. The method in accordance with claim 1, wherein providing the semiconductor substrate comprises:
  manufacturing back-surface contacts on a side facing away from the surface of the semiconductor substrate; and
  manufacturing back-surface through-contacts such that the back-surface contacts are connected to the readout electronics.

17. The method in accordance with claim 1, wherein depositing the sensor layer comprises depositing the sensor layer at a temperature of more than 600° C.

18. The method in accordance with claim 1, wherein manufacturing an integrated sensor structure comprises manufacturing a biological sensor, chemical sensor, physical sensor, multi-electrode array comprising carbon nanotubes coated for nerve simulation or signal derivation, or a selectable electrode structure.

\* \* \* \* \*